(12) United States Patent
Shen et al.

(10) Patent No.: US 8,207,015 B2
(45) Date of Patent: Jun. 26, 2012

(54) INTEGRATED CIRCUIT PACKAGING SYSTEM WITH PACKAGE-ON-PACKAGE AND METHOD OF MANUFACTURE THEREOF

(75) Inventors: Guo Qiang Shen, Shanghai (CN); Jae Hak Yee, Shanghai (CN); Denver Zhu, Shanghai (CN)

(73) Assignee: STATS ChipPAC Ltd., Singapore (SG)

( * ) Notice: Subject to any disclaimer, the term of this patent is extended or adjusted under 35 U.S.C. 154(b) by 140 days.

(21) Appl. No.: 12/772,142

(22) Filed: Apr. 30, 2010

(65) Prior Publication Data
US 2011/0266664 A1 Nov. 3, 2011

(51) Int. Cl.
*H01L 21/44* (2006.01)
*H01L 21/48* (2006.01)
*H01L 21/50* (2006.01)

(52) U.S. Cl. ........ 438/106; 438/111; 438/123; 257/686; 257/777; 257/E21.499; 257/E21.503; 257/E21.508

(58) Field of Classification Search .................. 438/111, 438/106, 123, 611, 612, 613; 257/686, 666, 257/777, E21.499, E21.503, E21.508
See application file for complete search history.

(56) References Cited

U.S. PATENT DOCUMENTS

| | | | |
|---|---|---|---|
| 6,380,624 B1 * | 4/2002 | Hung | 257/723 |
| 6,462,408 B1 * | 10/2002 | Wehrly, Jr. | 257/686 |
| 6,690,088 B2 | 2/2004 | MacIntyre | |
| 7,208,821 B2 * | 4/2007 | Ha et al. | 257/666 |
| 7,576,437 B2 | 8/2009 | Han et al. | |
| 7,692,311 B2 * | 4/2010 | Fan et al. | 257/777 |
| 2004/0108583 A1 * | 6/2004 | Roeters et al. | 257/686 |
| 2009/0032916 A1 * | 2/2009 | Shin et al. | 257/666 |

* cited by examiner

*Primary Examiner* — David Nhu
(74) *Attorney, Agent, or Firm* — Ishimaru & Associates LLP; Mikio Ishimaru; Stanley Chang

(57) ABSTRACT

A method of manufacture of an integrated circuit packaging system includes: applying a conductive material on a support structure; providing a bottom integrated circuit package having a bottom lead extended therefrom; attaching the bottom lead to the conductive material; stacking a top integrated circuit package over the bottom integrated circuit package, the top integrated circuit package having a top lead extending therefrom and the top lead over the bottom lead; attaching a conductive paste at an end portion of the top lead; and forming a stacking joint by flowing the conductive paste and the conductive material, the stacking joint below the top lead as well as below and above the bottom lead.

20 Claims, 7 Drawing Sheets

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for an integrated circuit packaging system with package-on-package.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection and space savings. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: applying a conductive material on a support structure; providing a bottom integrated circuit package having a bottom lead extended therefrom; attaching the bottom lead to the conductive material; stacking a top integrated circuit package over the bottom integrated circuit package, the top integrated circuit package having a top lead extending therefrom and the top lead over the bottom lead; attaching a conductive paste at an end portion of the top lead; and forming a stacking joint by flowing the conductive paste and the conductive material, the stacking joint below the top lead as well as below and above the bottom lead.

The present invention provides an integrated circuit packaging system, including: a bottom integrated circuit package having a bottom lead extended therefrom; a top integrated circuit package over the bottom integrated circuit package, the top integrated circuit package having a top lead extending therefrom and the top lead over the bottom lead, the top lead having an end portion; and a stacking joint below the top lead as well as below and above the bottom lead, the stacking joint attached to the bottom lead.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
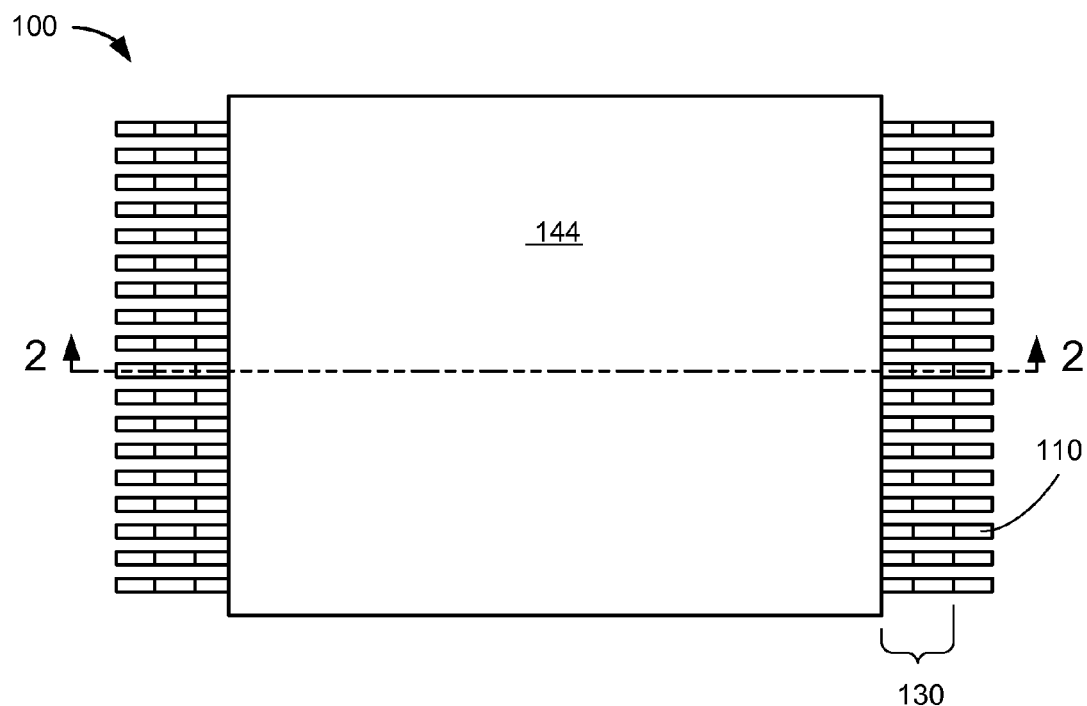
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can represent a configuration of a packaging system, which can include a thin small outline package (TSOP) package-on-package (PoP) using a solder wetting method or a wreck method. The wreck method is defined as an additional way to enable two objects to be joined to each other, with a paste material flowing to a connection area.

The top view depicts a bottom lead 110 and a top lead 130 mounted thereover. A top encapsulation 144, such as a cover including an encapsulant, an epoxy molding compound (EMC), or a molding material, can be formed over the top lead 130 exposing a portion of the top lead 130.

Figure 2:
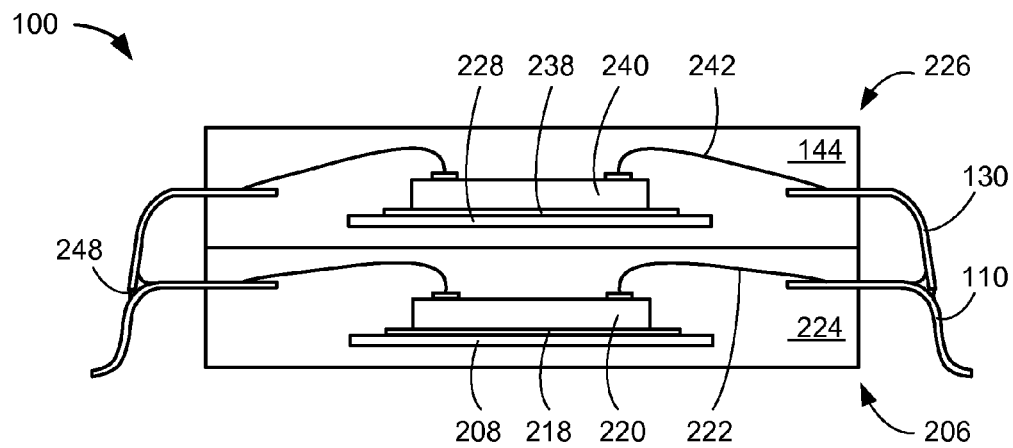
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a bottom integrated circuit package 206.

The bottom integrated circuit package 206 can include a bottom paddle 208, such as a die-attach paddle (DAP) or a die pad. The bottom paddle 208 can be adjacent to the bottom lead 110. The bottom paddle 208 can be surrounded by the bottom lead 110.

A bottom adhesive 218, such as a film or an epoxy, can be attached to the bottom paddle 208 and a bottom integrated circuit 220, such as an integrated circuit die, a wirebond integrated circuit, or a flip chip. The bottom integrated circuit 220 can be mounted over the bottom paddle 208. A bottom interconnect 222, such as a bond wire, a ribbon bond wire, or a conductive wire, can be connected to the bottom lead 110 and the bottom integrated circuit 220.

A bottom encapsulation 224, such as a cover including an encapsulant, an epoxy molding compound (EMC), or a molding material, can be formed over the bottom lead 110, the bottom paddle 208, the bottom adhesive 218, the bottom integrated circuit 220, and the bottom interconnect 222. The bottom encapsulation 224 can partially cover the bottom lead 110. A portion of the bottom lead 110 can be exposed from the bottom encapsulation 224 at non-horizontal sides of the bottom encapsulation 224.

The integrated circuit packaging system 100 can include a top integrated circuit package 226 mounted over the bottom integrated circuit package 206. For example, the top integrated circuit package 226 can be a top reformed package. The top integrated circuit package 226 can include a top paddle 228, such as a die-attach paddle (DAP) or a die pad.

The top paddle 228 can be adjacent to the top lead 130. The top lead 130 can be mounted over the bottom lead 110. The top paddle 228 can be surrounded by the top lead 130.

A top adhesive 238, such as a film or an epoxy, can be attached to the top paddle 228 and a top integrated circuit 240, such as an integrated circuit die, a wirebond integrated circuit, or a flip chip. The top integrated circuit 240 can be mounted over the top paddle 228. A top interconnect 242, such as a bond wire, a ribbon bond wire, or a conductive wire, can be connected to the top lead 130 and the top integrated circuit 240.

The top encapsulation 144 can be formed over the top lead 130, the top paddle 228, the top adhesive 238, the top integrated circuit 240, and the top interconnect 242. The top encapsulation 144 can partially cover the top lead 130. A portion of the top lead 130 can be exposed from the top encapsulation 144 at non-horizontal sides of the top encapsulation 144.

The top lead 130 can be attached to the bottom lead 110 with a stacking joint 248, such as a metal, a metallic alloy, or a conductive material. The stacking joint 248 can be formed to secure the top lead 130 over the bottom lead 110, providing a reliable connection. For illustrative purposes, the stacking joint 248 is not shown in FIG. 1, although it is possible to see the stacking joint 248 in FIG. 1.

Figure 3:
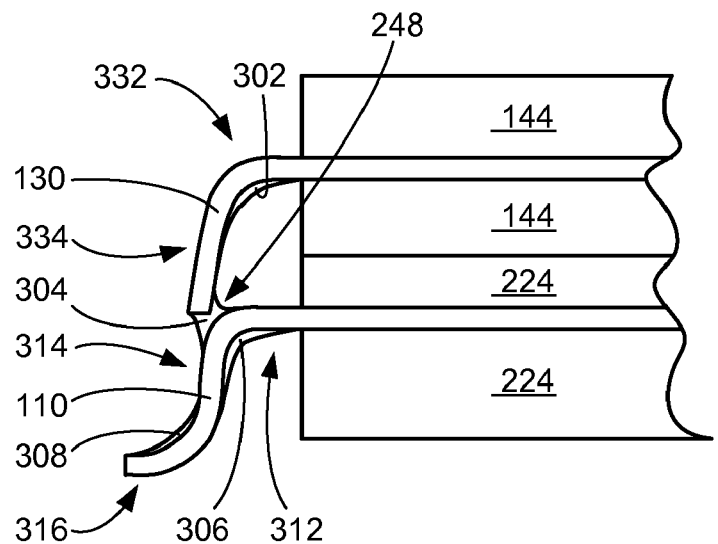
FIG. 3 is a more detailed view of a portion of the structure of FIG. 2.

Referring now to FIG. 3, therein is shown a more detailed view of a portion of the structure of FIG. 2. The more detailed view depicts the bottom lead 110 and the top lead 130 mounted thereover.

The bottom lead 110 can be exposed from the bottom encapsulation 224. The bottom lead 110 can include a bottom lead upper portion 312, a bottom lead non-horizontal portion 314, and a bottom lead lower portion 316.

The bottom lead upper portion 312 can extend from the non-horizontal sides of the bottom encapsulation 224. The bottom lead non-horizontal portion 314 can connect the bottom lead upper portion 312 and the bottom lead lower portion 316. The bottom lead upper portion 312, the bottom lead non-horizontal portion 314, and the bottom lead lower portion 316 can be non-planar with each other.

The bottom lead non-horizontal portion 314 can downwardly extend below a bottom surface of the bottom encapsulation 224. The bottom lead non-horizontal portion 314 can downwardly extend from the bottom lead upper portion 312 to the bottom lead lower portion 316. The bottom lead lower portion 316 can extend from the bottom lead non-horizontal portion 314 and away from the bottom encapsulation 224.

The bottom lead non-horizontal portion 314 can be at an obtuse angle with the bottom lead upper portion 312. The bottom lead non-horizontal portion 314 can be at an obtuse angle with the bottom lead lower portion 316.

The top lead 130 can be exposed from the top encapsulation 144. The top lead 130 can include a top lead upper portion 332 and a top lead non-horizontal portion 334 over the bottom lead non-horizontal portion 314.

The top lead upper portion 332 can extend from the non-horizontal sides of the top encapsulation 144. The top lead non-horizontal portion 334 can be connected to the top lead upper portion 332.

The top lead non-horizontal portion 334 can downwardly extend from the top lead upper portion 332. The top lead upper portion 332 and the top lead non-horizontal portion 334 can be non-planar with each other.

For illustrative purposes, the top lead upper portion 332 and the top lead non-horizontal portion 334 are shown connected by an adjoining portion having a curve shape, although the top lead upper portion 332 and the top lead non-horizontal portion 334 can be connected differently. For example, the top lead upper portion 332 can have a planar surface that physically intersects that of the top lead non-horizontal portion 334 at an obtuse angle.

The stacking joint 248 can be attached to the bottom lead 110. The stacking joint 248 can be formed below and above the bottom lead 110. For example, the stacking joint 248 can be formed on or below a bottom surface of the bottom lead upper portion 312. Also for example, the stacking joint 248 can be formed on or above a top surface of the bottom lead upper portion 312.

The stacking joint 248 can be formed around the bottom lead 110. The bottom lead non-horizontal portion 314 can be surrounded by the stacking joint 248. For example, the stacking joint 248 can be formed on the bottom lead non-horizontal portion 314. Also for example, the stacking joint 248 can be formed above or on a top surface of the bottom lead lower portion 316.

The stacking joint 248 can be formed below the top lead 130. For example, the stacking joint 248 can be formed on or below a bottom surface of the top lead upper portion 332.

The stacking joint 248 can be optionally formed above the top lead 130. For example, the stacking joint 248 can be formed on or above a top surface of the top lead upper portion 332. For illustrative purposes, the stacking joint 248 is shown only below the top lead 130, although the stacking joint 248 can be shown above the top surface of the top lead upper portion 332.

The top lead non-horizontal portion 334 can be surrounded by the stacking joint 248. For example, the stacking joint 248 can be on the top lead non-horizontal portion 334.

More specifically, the stacking joint 248 includes a top joint portion 302, an inter-lead portion 304, a mid joint portion 306, and a lower joint portion 308. The top joint portion 302 can be below the top lead upper portion 332 and the top lead non-horizontal portion 334. The top joint portion 302 is directly on a bottom side of the top lead upper portion 332. The inter-lead portion 304 can be between the top lead 130 and the bottom lead 110. The mid joint portion 306 can be below the bottom lead upper portion 312 and the bottom lead non-horizontal portion 314. The lower joint portion 308 is on and above the bottom lead non-horizontal portion 314 and the bottom lead lower portion 316.

The stacking joint 248 can be reliably robust without lead open and short problems between the bottom lead 110 and the top lead 130, providing an improved yield. The improved yield can be measured in terms of units per hour (UPH). The improved yield can reduce manufacturing costs.

For illustrative purposes, the bottom encapsulation 224 and the top encapsulation 144 are shown having rectangular shapes, although the bottom encapsulation 224 and the top encapsulation 144 can have different shapes. For example, the corresponding non-horizontal sides of the bottom encapsulation 224 and the top encapsulation 144 can be curved or slanted.

Figure 4:
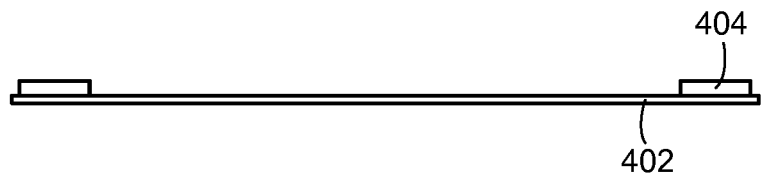
FIG. 4 is a cross-sectional view of a portion of the integrated circuit packaging system of FIG. 1 in a conductive material applying phase of a first manufacturing process.

Referring now to FIG. 4, therein is shown a cross-sectional view of a portion of the integrated circuit packaging system 100 of FIG. 1 in a conductive material applying phase of a first manufacturing process. The conductive material applying phase can include a support structure 402, such as a jig, a dummy strip, or a plate.

The support structure 402 can have a flat surface. The support structure 402 can include a fiducial mark that can be used for alignment.

A conductive material 404, such as a solder paste or a metallic paste, can be applied on the support structure 402. The conductive material 404 can be applied in a pattern that matches a lead position or a footprint of the bottom integrated circuit package 206 of FIG. 2. For example, the pattern can be a printed area on the support structure 402.

For example, the conductive material 404 can be applied by printing method using a stencil or any other methods including screening and dispensing. Also for example, the conductive material 404 can include a metal or a metallic alloy mixed with flux.

Figure 5:
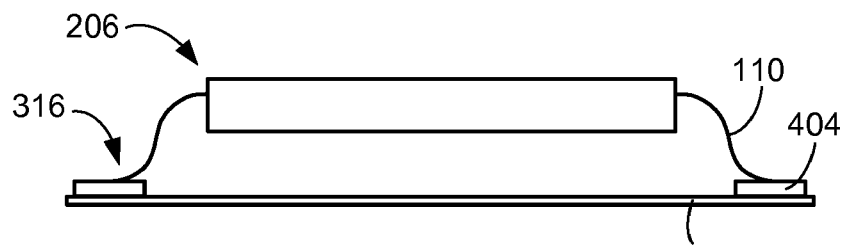
FIG. 5 is the structure of FIG. 4 in a bottom package mounting phase.

Referring now to FIG. 5, therein is shown the structure of FIG. 4 in a bottom package mounting phase. The bottom integrated circuit package 206 can have the bottom lead 110 extended therefrom.

The bottom integrated circuit package 206 can be mounted over the support structure 402. The bottom integrated circuit package 206 can be placed on the printed area having the conductive material 404 applied thereon. The bottom lead lower portion 316 can be attached to the conductive material 404.

Figure 6:
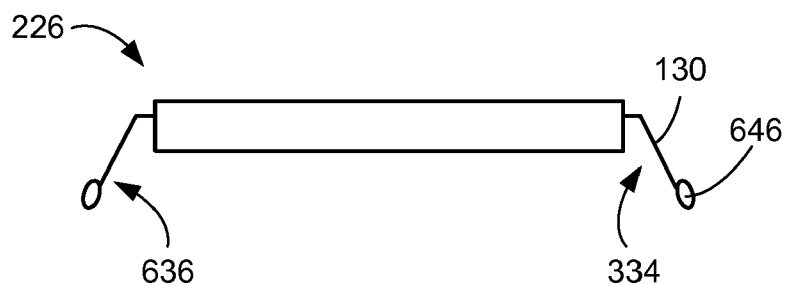
FIG. 6 is the structure of FIG. 5 in a paste applying phase.

Referring now to FIG. 6, therein is shown the structure of FIG. 5 in a paste applying phase. The top integrated circuit package 226 can have the top lead 130 extended therefrom. The top lead non-horizontal portion 334 having an end portion 636 can attach to a conductive paste 646, such as a solder paste, a metal, a metallic alloy, flux, or a combination thereof.

For example, the end portion 636 can be at a tip of the top lead non-horizontal portion 334. Also for example, the conductive paste 646 can be attached to the end portion 636 by dipping the top lead non-horizontal portion 334 into a reservoir (not shown) of the conductive paste 646 or by dispensing the conductive paste 646 onto the top lead non-horizontal portion 334.

Figure 7:
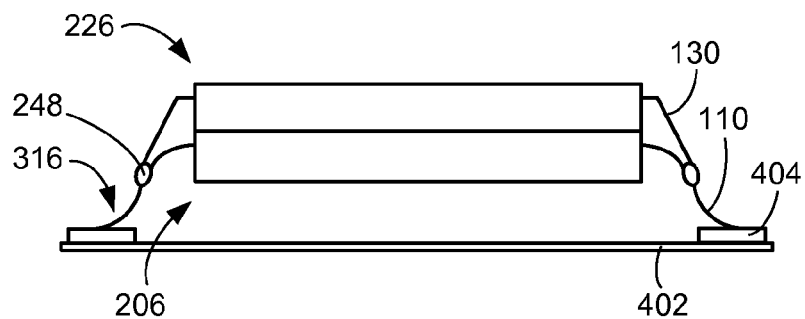
FIG. 7 is the structure of FIG. 6 in a top package mounting phase.

Referring now to FIG. 7, therein is shown the structure of FIG. 6 in a top package mounting phase. The top integrated circuit package 226 can be mounted over the bottom integrated circuit package 206. The top lead 130 can be stacked over the bottom lead 110.

The stacking joint 248 can be formed by flowing the conductive paste 646 of FIG. 6 and the conductive material 404.

The stacking joint 248 can be formed below the top lead 130 as well as below and above the bottom lead 110. For example, the conductive paste 646 and the conductive material 404 can be flowed using a reflowing process including reflow ovens, infrared (IR) reflow, hot air pencils, or any wetting processes.

For illustrative purposes, the top package mounting phase is shown with the conductive material 404 in a process of being reflowed. In other words, the conductive paste 646 and the conductive material 404 can upwardly flow, covering portions of the bottom lead 110 and the top lead 130.

After the reflow process, there can be very little or no remnant of the conductive material 404 that remains between the bottom lead 110 and the support structure 402. In other words, most, if not all, of the conductive material 404 can upwardly flow from the support structure 402 to the bottom lead 110 to form the stacking joint 248.

The conductive material 404 can upwardly flow by a wetting force or a wrecking force during the reflow process, thereby providing a good connection between the bottom lead 110 and the top lead 130. The wrecking force is defined as an influence that affects the conductive material 404 and the conductive paste 646 to upwardly flow to the bottom lead 110 and the top lead 130 to form the stacking joint 248.

The volume or a fillet height of the stacking joint 248 can be based on a thickness or the volumes of the conductive material 404 and the conductive paste 646. For example, the volume or the fillet height of the stacking joint 248 can be based on an opening size, a thickness, or a mesh size of a stencil that is used to print the conductive material 404, a powder size of the conductive material 404, or a combination thereof. Also for example, a bigger stencil opening can be more helpful to wetting methods for TSOP PoP soldering.

For illustrative purposes, the support structure 402 is shown, although the support structure 402 can be removed in subsequent process steps. For example, the bottom integrated circuit package 206 with the top integrated circuit package 226 mounted thereover can be subsequently processed after the support structure 402 is removed.

The stacking joint 248 can have characteristics of being formed by flowing the conductive material 404 and the conductive paste 646. The characteristics can include the stacking joint 248 above or on the top surface of the bottom lead lower portion 316, the bottom lead non-horizontal portion 314 surrounded by the stacking joint 248, the stacking joint 248 on the bottom lead non-horizontal portion 314, the stacking joint 248 on or below the bottom surface of the bottom lead upper portion 312, the stacking joint 248 on or above the top surface of the bottom lead upper portion 312, or a combination thereof.

The characteristics can also include the stacking joint 248 on or above the top surface of the top lead upper portion 332, the top lead non-horizontal portion 334 surrounded by the stacking joint 248, the stacking joint 248 on the top lead non-horizontal portion 334, or a combination thereof.

More specifically, the flowing of the conductive material 404 and the conductive paste 646 to form the stacking joint 248 includes forming the top joint portion 302 of FIG. 3, the inter-lead portion 304 of FIG. 3, the mid joint portion 306 of FIG. 3, and the lower joint portion 308 of FIG. 3. The top joint portion 302 is not formed without the combined volume from the conductive material 404 and the conductive paste 646, and without adversely shorting the top lead 130 with a further of the top lead 130 and the bottom lead 110 with a further of the bottom lead 110, or a combination thereof. The lower joint portion 308 is not formed without the flowing of the conductive material 404 with the conductive paste 646 because the volume required without this flowing method would adversely short the top lead 130 with a further of the top lead 130 and the bottom lead 110 with a further of the bottom lead 110, or a combination thereof.

It has been discovered that the integrated circuit packaging system 100 improves reliability. The stacking joint 248 has a sufficient volume to form the top joint portion 302, the lower joint portion 308, or a combination thereof. In other words, the volume of the stacking joint 248 covers the top lead 130 and the bottom lead 110 to form a robust mechanical and electrical joint without creating an open or a break between the top lead 130 and the bottom lead 110. If the volume of the stacking joint 248 is not sufficient or in excess, the volume of the conductive material 404 or the conductive paste 646 is effectively controlled by increasing or decreasing, respectively. The volume of the stacking joint 248 is effectively controlled with a proper volume ratio of the conductive paste 646 to the conductive material 404, resulting in a stable connection and the improved reliability without main defects such as open and short problems.

It has also been discovered that the integrated circuit packaging system 100 improves yield. With the reflow process, the conductive material 404 and the conductive paste 646 are expected to form a perfect lead soldering of the bottom lead 110 and the top lead 130 to form the stacking joint 248. The perfect lead soldering is formed with a simple tool and design of the support structure 402 and an easy handling flow of the conductive material 404 and the conductive paste 646, resulting in a better process margin and a productivity yield of approximately 98%, which is greater than a productivity yield of 80% using other methods.

Figure 8:
FIG. 8 is a cross-sectional view of a portion of the integrated circuit packaging system in a conductive material applying phase of a second manufacturing process.

Referring now to FIG. 8, therein is shown a cross-sectional view of a portion of the integrated circuit packaging system 100 in a conductive material applying phase of a second manufacturing process. The conductive material applying phase can include the support structure 402.

The conductive material 404 can be applied on the support structure 402. For example, the conductive material 404 can be applied by printing method using a stencil or other methods including screening or dispensing. Also for example, the conductive material 404 can include a metal or a metallic alloy mixed with flux.

Figure 9:
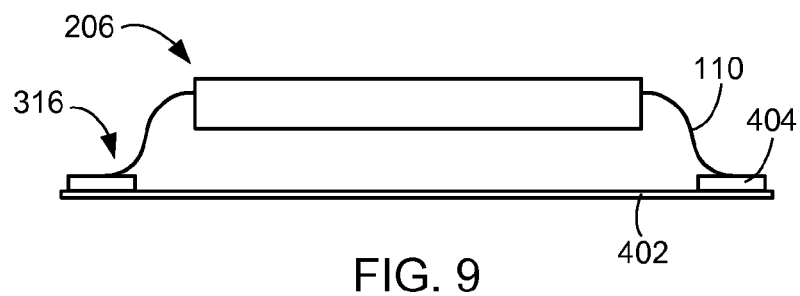
FIG. 9 is the structure of FIG. 8 in a bottom package mounting phase.

Referring now to FIG. 9, therein is shown the structure of FIG. 8 in a bottom package mounting phase. The bottom integrated circuit package 206 can have the bottom lead 110 extended therefrom.

The bottom integrated circuit package 206 can be mounted over the support structure 402. The bottom integrated circuit package 206 can be placed on the conductive material 404. The bottom lead lower portion 316 of the bottom lead 110 can be attached to the conductive material 404.

Figure 10:
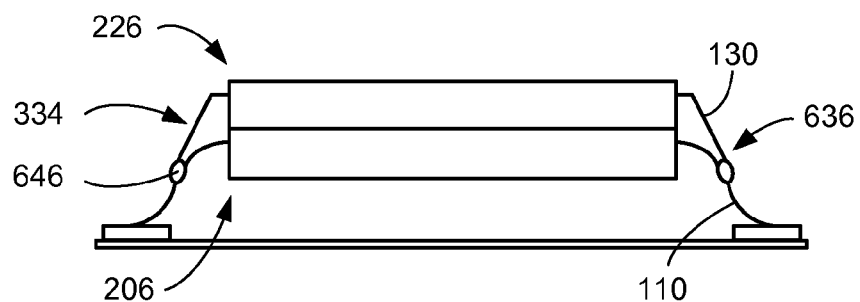
FIG. 10 is the structure of FIG. 9 in a paste applying phase.

Referring now to FIG. 10, therein is shown the structure of FIG. 9 in a paste applying phase. The top integrated circuit package 226 can be mounted over the bottom integrated circuit package 206.

The top integrated circuit package 226 can have the top lead 130 extended therefrom. The top lead 130 can include the top lead non-horizontal portion 334 having the end portion 636.

The top lead non-horizontal portion 334 can be mounted with the end portion 636 over a portion of the bottom lead 110. The portion of the bottom lead 110 and the end portion 636 thereover can be attached with the conductive paste 646. For example, the conductive paste 646 can be attached by dispensing the conductive paste 646 between the portion and the end portion 636.

Figure 11:
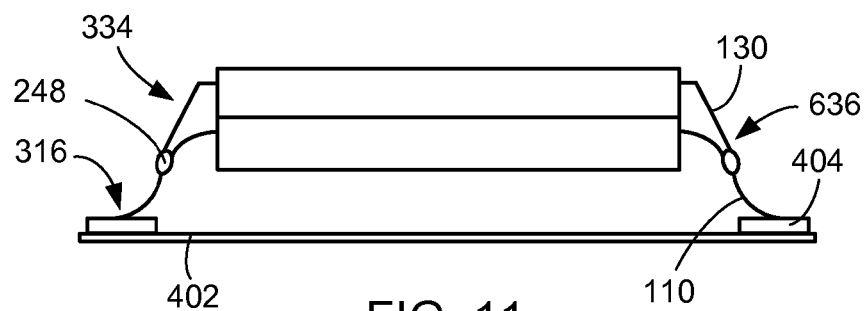
FIG. 11 is the structure of FIG. 10 in a reflowing phase.

Referring now to FIG. 11, therein is shown the structure of FIG. 10 in a reflowing phase. The stacking joint 248 can be formed by flowing the conductive paste 646 of FIG. 10 and the conductive material 404. The stacking joint 248 can be formed to attach the portion of the bottom lead 110 and the end portion 636 of the top lead non-horizontal portion 334 thereover.

The stacking joint 248 can be formed below the top lead 130 as well as below and above the bottom lead 110. For example, the conductive paste 646 and the conductive material 404 can be flowed using a reflowing process including reflow ovens, infrared (IR) reflow, or hot air pencils.

For illustrative purposes, the reflowing phase is shown with the conductive material 404 in a process of being reflowed. In other words, the conductive paste 646 and the conductive material 404 can upwardly flow, covering portions of the bottom lead 110 and the top lead 130.

It has been discovered that the integrated circuit packaging system 100 further improves the reliability. The bottom lead 110 and the end portion 636 of the top lead 130 thereover can be attached with the conductive paste 646 therebetween, without requiring a dipping process for the top integrated circuit package 226. A more robust joining quality is expected between the bottom lead 110 and the top lead 130. The more robust joining quality is provided by preventing system dirtiness and contamination, thereby further improving the reliability.

Figure 12:
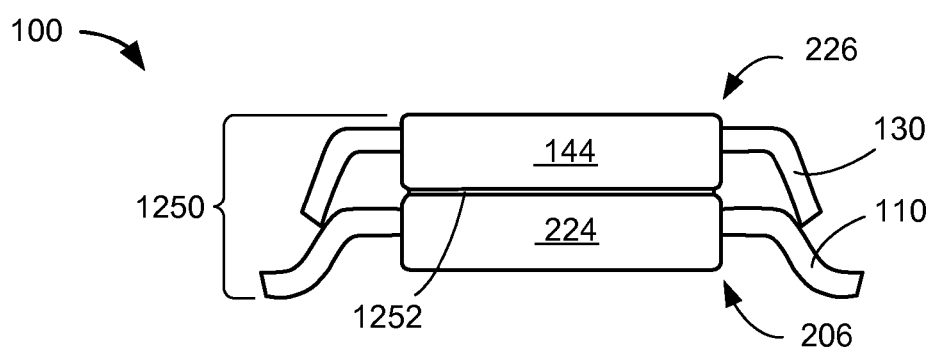
FIG. 12 is a cross-sectional view of a portion of the integrated circuit packaging system in a stacking phase of a third manufacturing process.

Referring now to FIG. 12, therein is shown a cross-sectional view of a portion of the integrated circuit packaging system 100 in a stacking phase of a third manufacturing process. The integrated circuit packaging system 100 can include the bottom integrated circuit package 206 having the bottom lead 110.

The bottom encapsulation 224 can be formed over the bottom lead 110. The bottom encapsulation 224 can partially cover the bottom lead 110. A portion of the bottom lead 110 can be exposed from the bottom encapsulation 224 at non-horizontal sides of the bottom encapsulation 224.

The integrated circuit packaging system 100 can include the top integrated circuit package 226 having the top lead 130. The top encapsulation 144 can be formed over the top lead 130.

The top encapsulation 144 can partially cover the top lead 130. A portion of the top lead 130 can be exposed from the top encapsulation 144 at non-horizontal sides of the top encapsulation 144.

A stack unit 1250 can be formed by mounting the top integrated circuit package 226 over the bottom integrated circuit package 206. The top lead 130 can be over the bottom lead 110.

The top lead 130 can be attached to the bottom lead 110 by a direct lead soldering. The direct lead soldering is defined as a soldering with a paste material, such as a solder paste or a metallic paste, between the top lead 130 and the bottom lead 110 without another material attached thereto to help or assist.

The top integrated circuit package 226 can be attached to the bottom integrated circuit package 206 with an attach layer 1252, such as a film or an epoxy. The attach layer 1252 can be attached between the bottom integrated circuit package 206 and the top integrated circuit package 226.

Figure 13:
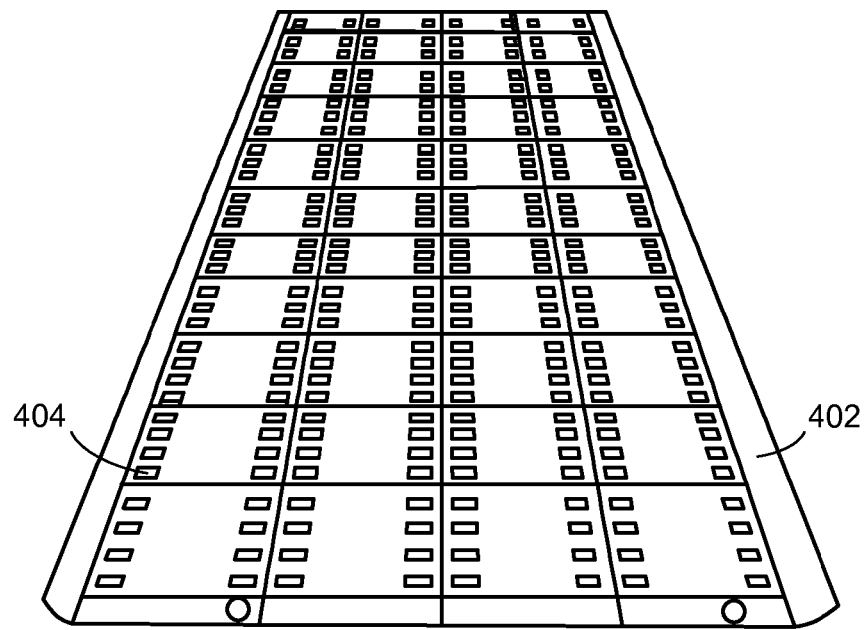
FIG. 13 is the structure of FIG. 12 in a conductive material applying phase.

Referring now to FIG. 13, therein is shown the structure of FIG. 12 in a conductive material applying phase. The conductive material applying phase can include the support structure 402.

The conductive material 404 can be applied on the support structure 402. For example, the conductive material 404 can be applied by printing method using a stencil or other methods including screening or dispensing. Also for example, the conductive material 404 can include a metal or a metallic alloy mixed with flux.

Figure 14:
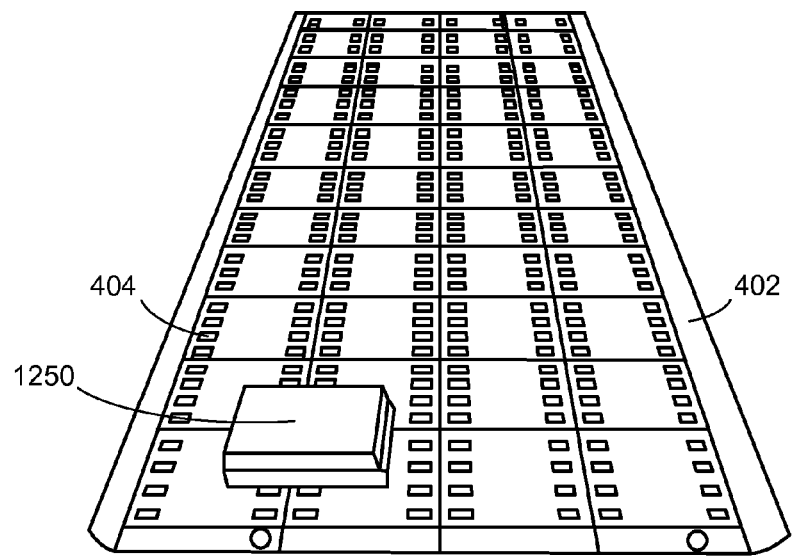
FIG. 14 is the structure of FIG. 13 in a stack mounting phase.

Referring now to FIG. 14, therein is shown the structure of FIG. 13 in a stack mounting phase. The stack unit 1250 can be mounted over the support structure 402. The stack unit 1250 can be placed on the conductive material 404. The bottom lead 110 of FIG. 12 can be attached to the conductive material 404.

Figure 15:
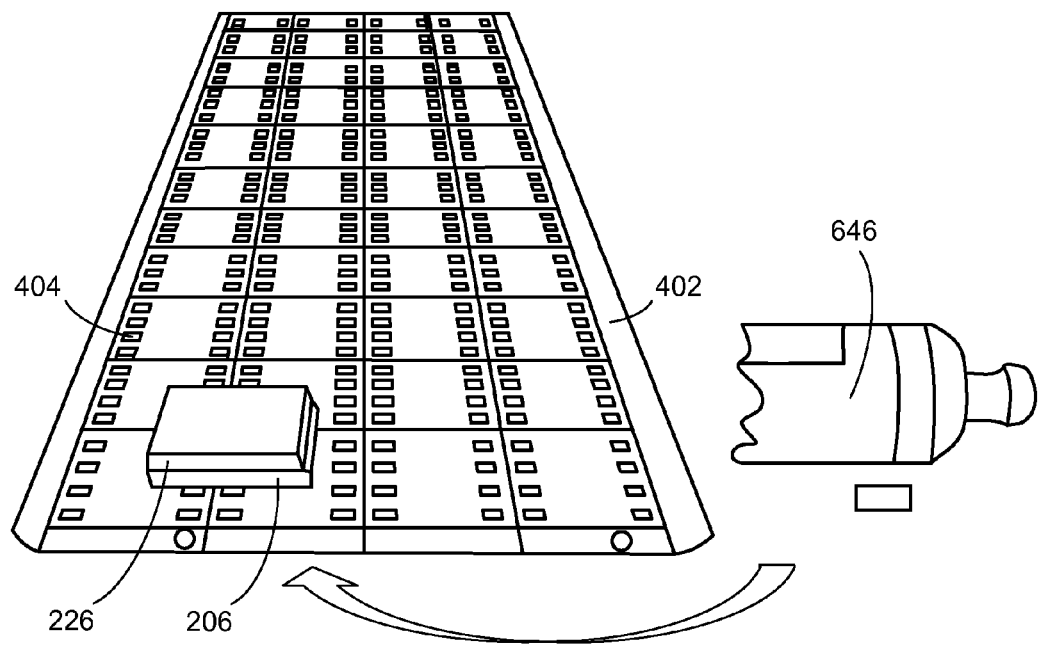
FIG. 15 is the structure of FIG. 14 in a reflowing phase.

Referring now to FIG. 15, therein is shown the structure of FIG. 14 in a reflowing phase. The top integrated circuit package 226 and the bottom integrated circuit package 206 can be attached with the conductive paste 646.

For illustrative purposes, the conductive paste 646 is provided in a bottle or a container. As depicted by an arrow, the conductive paste 646 can be applied to the bottom lead 110 of FIG. 12 and the top lead 130 of FIG. 12 stacked thereover. For example, the conductive paste 646 can be applied by dispensing the conductive paste 646 onto the bottom lead 110 and the top lead 130.

A stacking joint can be formed by flowing the conductive paste 646 and the conductive material 404. For example, the conductive paste 646 and the conductive material 404 can be flowed using a reflowing process including reflow ovens, infrared (IR) reflow, or hot air pencils.

The top integrated circuit package 226 and the bottom integrated circuit package 206 can have a lead alignment. The lead alignment is defined as the top integrated circuit package 226 and the bottom integrated circuit package 206 are at approximately the same X- and Y-axis position, and the top lead 130 and the bottom lead 110 are approximately the same in X- and Y-axis position, width, length, or a combination thereof.

Figure 16:
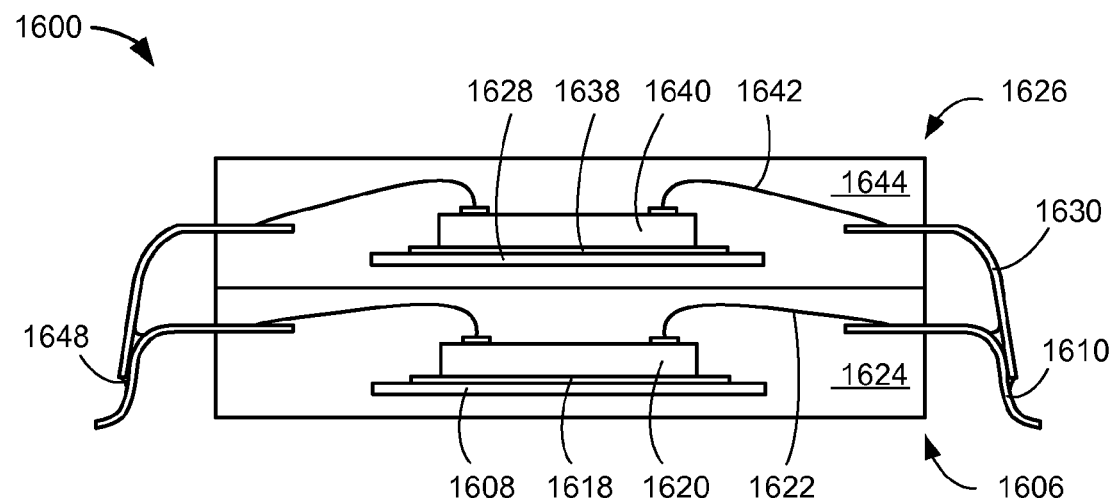
FIG. 16 is a cross-sectional view as exemplified by the top view of FIG. 1 of an integrated circuit packaging system in a first embodiment of the present invention.

Referring now to FIG. 16, therein is shown a cross-sectional view as exemplified by the top view of FIG. 1 of an integrated circuit packaging system 1600 in a first embodiment of the present invention. The integrated circuit packaging system 1600 can be formed in a manner similar to the integrated circuit packaging system 100 of FIG. 1, except for the formation of the top lead 130 of FIG. 1.

The integrated circuit packaging system 1600 can include a bottom integrated circuit package 1606 having a bottom paddle 1608, a bottom lead 1610, a bottom adhesive 1618, a bottom integrated circuit 1620, a bottom interconnect 1622, and a bottom encapsulation 1624. The bottom integrated circuit package 1606 can be formed in a manner similar to the bottom integrated circuit package 206 of FIG. 2.

The integrated circuit packaging system 1600 can include a top integrated circuit package 1626 having a top paddle 1628, a top lead 1630, a top adhesive 1638, a top integrated circuit 1640, a top interconnect 1642, and a top encapsulation 1644. The top integrated circuit package 1626 can be formed in a manner similar to the top integrated circuit package 226 of FIG. 2, except for the formation of the top lead 1630.

The top lead 1630 can be mounted over the bottom lead 1610. The top lead 1630 can downwardly extend below a top surface of the bottom lead 1610. The top lead 1630 can be adjacent to a non-horizontal portion of the bottom lead 1610.

The top lead 1630 can be attached to the bottom lead 1610 with a stacking joint 1648. The stacking joint 1648 can be formed in a manner similar to the stacking joint 248 of FIG. 2.

Figure 17:
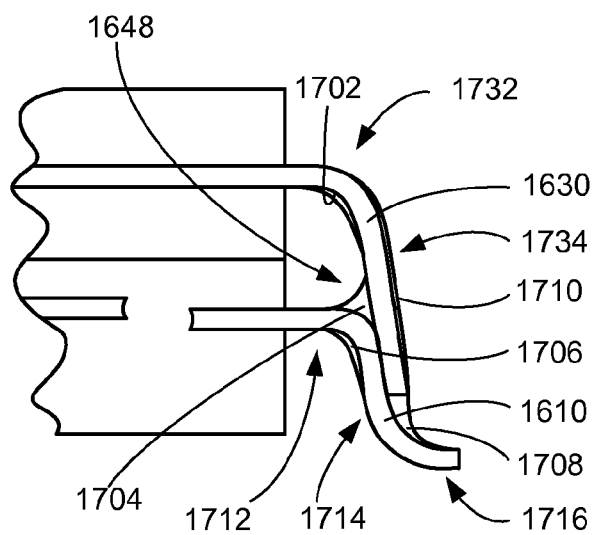
FIG. 17 is a more detailed view of a portion of the structure of FIG. 16.

Referring now to FIG. 17, therein is shown a more detailed view of a portion of the structure of FIG. 16. The more detailed view depicts the bottom lead 1610 and the top lead 1630 mounted thereover.

The bottom lead 1610 can have a bottom lead structure including a bottom lead upper portion 1712, a bottom lead non-horizontal portion 1714, and a bottom lead lower portion 1716. The bottom lead structure can be formed in a manner similar to the bottom lead structure of FIG. 3.

The top lead 1630 can have a top lead structure including a top lead upper portion 1732 and a top lead non-horizontal portion 1734. The top lead structure can be formed in a manner similar to the top lead structure of FIG. 3, except for the formation of the top lead non-horizontal portion 1734.

The top lead non-horizontal portion 1734 can downwardly extend from the top lead upper portion 1732. The top lead non-horizontal portion 1734 can downwardly extend below the bottom lead upper portion 1712.

The top lead non-horizontal portion 1734 can be adjacent to a portion of the bottom lead non-horizontal portion 1714. The top lead 1630 can be attached to the bottom lead 1610 with the stacking joint 1648.

More specifically, the stacking joint 1648 includes a top joint portion 1702, an inter-lead portion 1704, a mid joint portion 1706, a lower joint portion 1708, and an outmost joint portion 1710. The top joint portion 1702 can be below the top lead upper portion 1732 and the top lead non-horizontal portion 1734. The inter-lead portion 1704 can be between the top lead 1630 and the bottom lead 1610 and above the bottom lead 1610. The mid joint portion 1706 can be below the bottom lead upper portion 1712 and the bottom lead non-horizontal portion 1714. The lower joint portion 1708 is on and above the bottom lead non-horizontal portion 1714 and the bottom lead lower portion 1716. The lower joint portion 1708 can also contact the top lead 1630. The outmost joint portion 1710 is on and above the top lead non-horizontal portion 1734. The outmost joint portion 1710 can also contact the lower joint portion 1708.

The flowing of the conductive material 404 of FIG. 15 and the conductive paste 646 of FIG. 15 to form the stacking joint 1648 includes forming the top joint portion 1702, the inter-lead portion 1704, the mid joint portion 1706, the lower joint portion 1708, and the outmost joint portion 1710. The top joint portion 1702 is not formed without the combined volume from the conductive material 404 and the conductive paste 646, and without adversely shorting the top lead 1630 with a further of the top lead 1630 and the bottom lead 1610 with a further of the bottom lead 1610, or a combination thereof. The lower joint portion 1708 is not formed without the flowing of the conductive material 404 with the conductive paste 646 because the volume required without this flowing method would adversely short the top lead 1630 with a further of the top lead 1630 and the bottom lead 1610 with a further of the bottom lead 1610, or a combination thereof.

Figure 18:
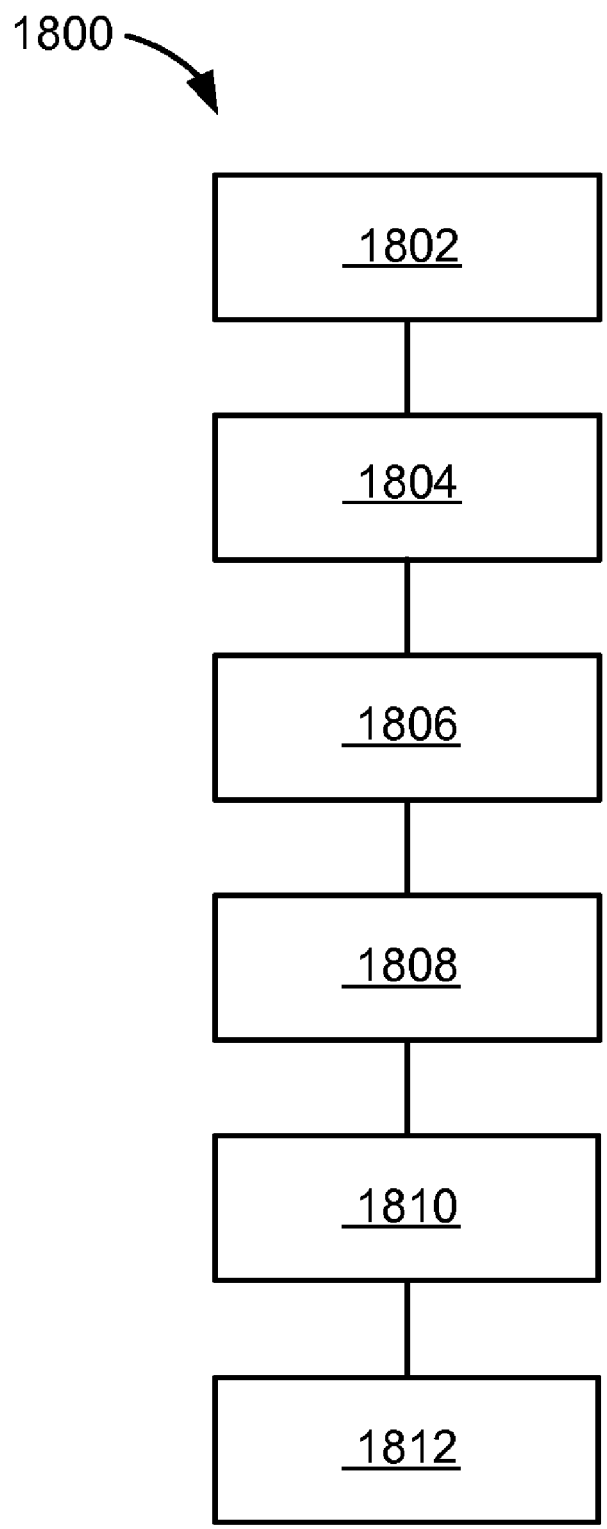
FIG. 18 is a flow chart of a method of manufacture of the integrated circuit packaging system in a further embodiment of the present invention.

Referring now to FIG. 18, therein is shown a flow chart of a method 1800 of manufacture of the integrated circuit packaging system 100 in a further embodiment of the present invention. The method 1800 includes: applying a conductive material on a support structure in a block 1802; providing a bottom integrated circuit package having a bottom lead extended therefrom in a block 1804; attaching the bottom lead to the conductive material in a block 1806; stacking a top integrated circuit package over the bottom integrated circuit package, the top integrated circuit package having a top lead extending therefrom and the top lead over the bottom lead in a block 1808; attaching a conductive paste at an end portion of the top lead in a block 1810; and forming a stacking joint by flowing the conductive paste and the conductive material, the stacking joint below the top lead and below and above the bottom lead in a block 1812.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    applying a conductive material on a support structure;
    providing a bottom integrated circuit package having a bottom lead extended therefrom;
    attaching the bottom lead to the conductive material;
    stacking a top integrated circuit package over the bottom integrated circuit package, the top integrated circuit package having a top lead extending therefrom and the top lead over the bottom lead, the top lead having a top lead upper portion;
    attaching a conductive paste at an end portion of the top lead; and
    forming a stacking joint by flowing the conductive paste and the conductive material, the stacking joint directly on a bottom side of the top lead upper portion as well as below and above the bottom lead.

2. The method as claimed in claim 1 wherein forming the stacking joint includes upwardly flowing the conductive material from the support structure.

3. The method as claimed in claim 1 wherein applying the conductive material includes controlling the volume of the conductive material.

4. The method as claimed in claim 1 wherein applying the conductive material includes printing the conductive material on the support structure.

5. The method as claimed in claim 1 wherein stacking the top integrated circuit package includes mounting the top lead over the bottom lead, the top lead downwardly extending below a top surface of the bottom lead.

6. A method of manufacture of an integrated circuit packaging system comprising:
    applying a conductive material on a support structure, the conductive material having a controlled volume;
    providing a bottom integrated circuit package having a bottom lead extended therefrom;
    attaching the bottom lead to the conductive material;
    stacking a top integrated circuit package over the bottom integrated circuit package, the top integrated circuit package having a top lead extending therefrom and the top lead over the bottom lead, the top lead having a top lead upper portion;
    attaching a conductive paste at an end portion of the top lead; and
    forming a stacking joint by flowing the conductive paste and the conductive material, the stacking joint directly on a bottom side of the top lead upper portion as well as below and above the bottom lead.

7. The method as claimed in claim 6 wherein attaching the conductive paste includes attaching the conductive paste between the bottom lead and the end portion of the top lead.

8. The method as claimed in claim 6 wherein stacking the top integrated circuit package over the bottom integrated circuit package includes attaching an attach layer between the bottom integrated circuit package and the top integrated circuit package.

9. The method as claimed in claim 6 wherein applying the conductive material includes applying a solder paste on the support structure.

10. The method as claimed in claim 6 wherein forming the stacking joint includes forming the stacking joint on the bottom lead.

11. An integrated circuit packaging system comprising:
a bottom integrated circuit package having a bottom lead extended therefrom;
a top integrated circuit package over the bottom integrated circuit package, the top integrated circuit package having a top lead extending therefrom and the top lead over the bottom lead, the top lead having a top lead upper portion and an end portion; and
a stacking joint directly on a bottom side of the top lead upper portion as well as below and above the bottom lead, the stacking joint attached to the bottom lead.

12. The system as claimed in claim 11 wherein the stacking joint covers the top lead and the bottom lead.

13. The system as claimed in claim 11 wherein the stacking joint is above the top lead.

14. The system as claimed in claim 11 wherein the stacking joint is around the bottom lead.

15. The system as claimed in claim 11 wherein the top integrated circuit package includes the top lead over the bottom lead, the top lead downwardly extending below a top surface of the bottom lead.

16. The system as claimed in claim 11 wherein:
the bottom integrated circuit package having the bottom lead includes the bottom lead having a bottom lead upper portion, a bottom lead non-horizontal portion downwardly extended from the bottom lead upper portion, and a bottom lead lower portion extended from the bottom lead non-horizontal portion; and
the top integrated circuit package having the top lead includes the top lead having a top lead upper portion and a top lead non-horizontal portion downwardly extended therefrom and over the bottom lead non-horizontal portion.

17. The system as claimed in claim 16 wherein the stacking joint is below the top lead upper portion.

18. The system as claimed in claim 16 wherein the top integrated circuit package over the bottom integrated circuit package includes an attach layer between the bottom integrated circuit package and the top integrated circuit package.

19. The system as claimed in claim 16 wherein the stacking joint is below the bottom lead upper portion.

20. The system as claimed in claim 16 wherein the stacking joint is on the bottom lead non-horizontal portion.

* * * * *